United States Patent
Ulrich et al.

[11] Patent Number: 6,020,639
[45] Date of Patent: *Feb. 1, 2000

[54] SEMICONDUCTOR WAFER WITH REMOVED CVD COPPER

[75] Inventors: Bruce Dale Ulrich, Beaverton, Oreg.; Tue Nguyen; Masato Kobayashi, both of Vancouver, Wash.

[73] Assignees: Sharp Laboratories of America, Inc., Camas, Wash.; Sharp Kabushiki Kaisha, Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/223,927

[22] Filed: Dec. 31, 1998

Related U.S. Application Data

[62] Division of application No. 08/995,112, Dec. 19, 1997, Pat. No. 5,897,379.

[51] Int. Cl.[7] ................................................. H01L 23/48
[52] U.S. Cl. ..................... 257/750; 257/735; 257/786; 257/787
[58] Field of Search ................................... 257/750, 735, 257/786, 787

[56] References Cited

U.S. PATENT DOCUMENTS

| | | |
|---|---|---|
| 4,525,383 | 6/1985 | Saito . |
| 5,475,236 | 12/1995 | Yoshizaki . |
| 5,490,040 | 2/1996 | Gaudenzi et al. . |
| 5,962,926 | 10/1999 | Torres et al. . |
| 5,965,948 | 10/1999 | Okamoto . |

*Primary Examiner*—Stephen D. Meier
*Attorney, Agent, or Firm*—David C. Ripma

[57] ABSTRACT

A method of using diluted nitric acid and an edge bead removal tool to remove copper from the perimeter of a semiconductor wafer is provided. In one embodiment, sensitive areas of the wafer are covered with photoresist, and the wafer perimeter cleared of photoresist, before the acid is applied. In another embodiment, sensitive areas of the wafer are protected with water spray as the copper etchant is applied. In a third embodiment, the nitric acid is applied to clear the wafer perimeter of copper before a chemical mechanical polishing (CMP) is performed on the layer of deposited copper. The excess thickness of copper protects copper interconnection structures from reacting with the copper etchant. All these methods permit copper to be removed at a low enough temperature that copper oxides are not formed. A semiconductor wafer cleaned of copper in accordance with the above-described method, and a system for low temperature copper removal is also provided.

8 Claims, 8 Drawing Sheets

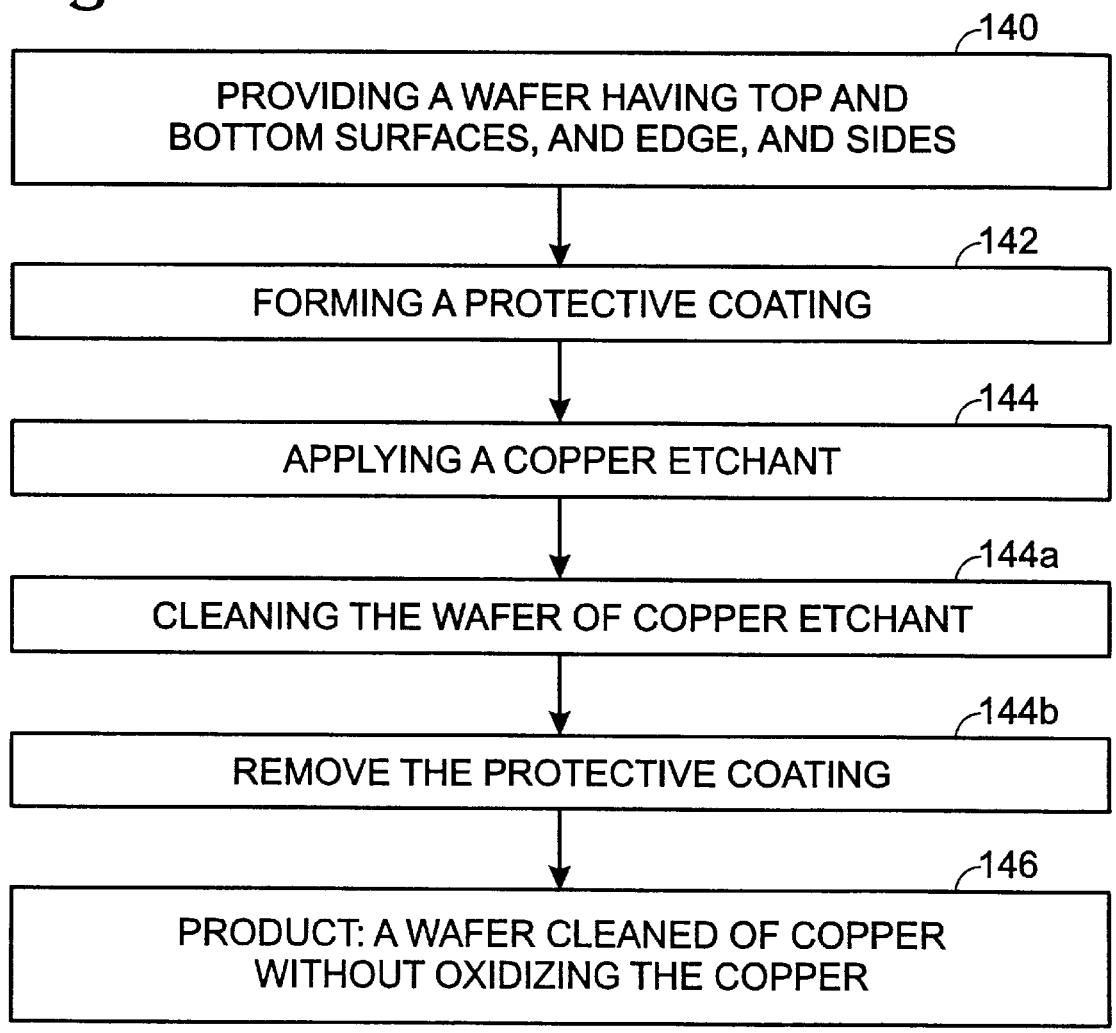

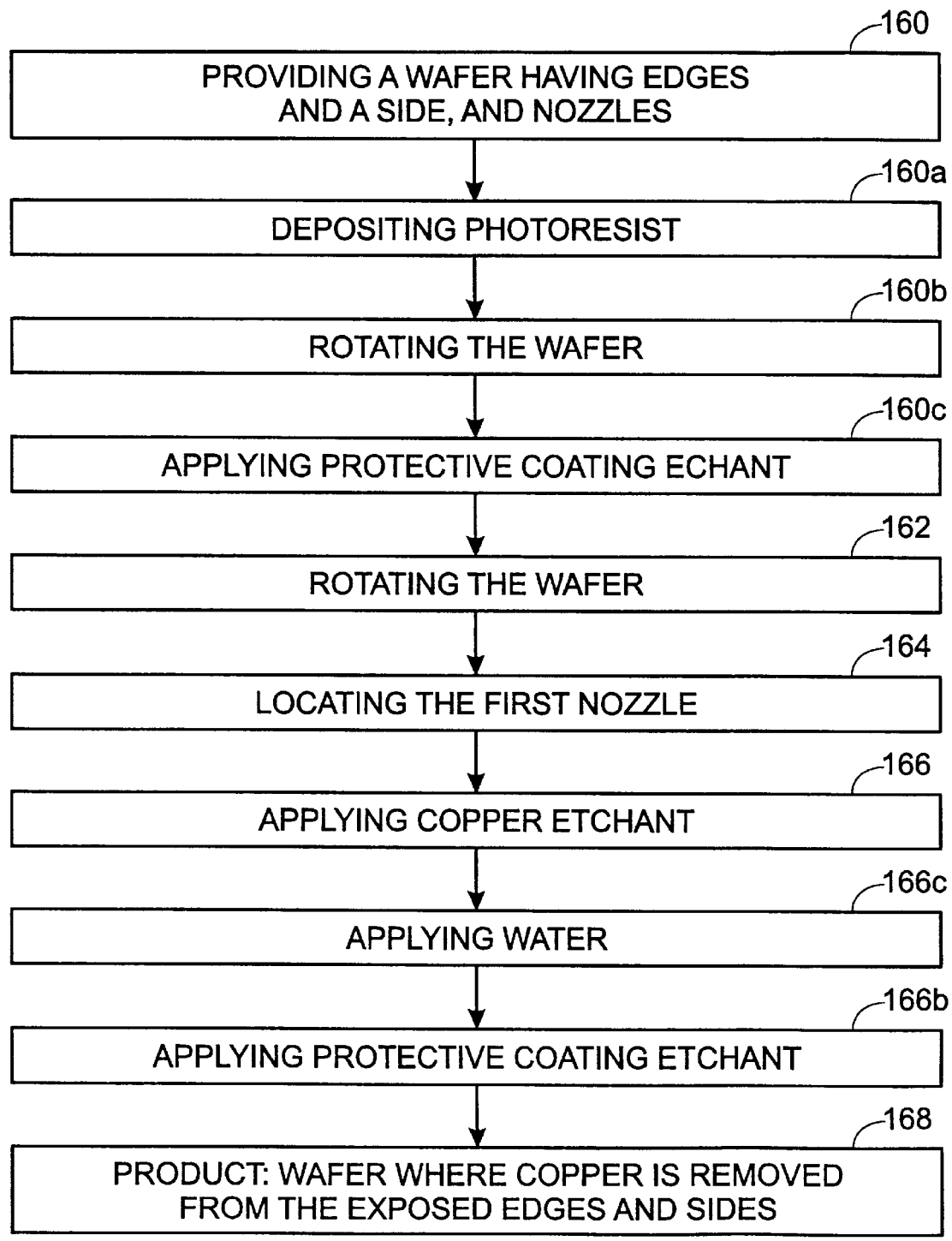

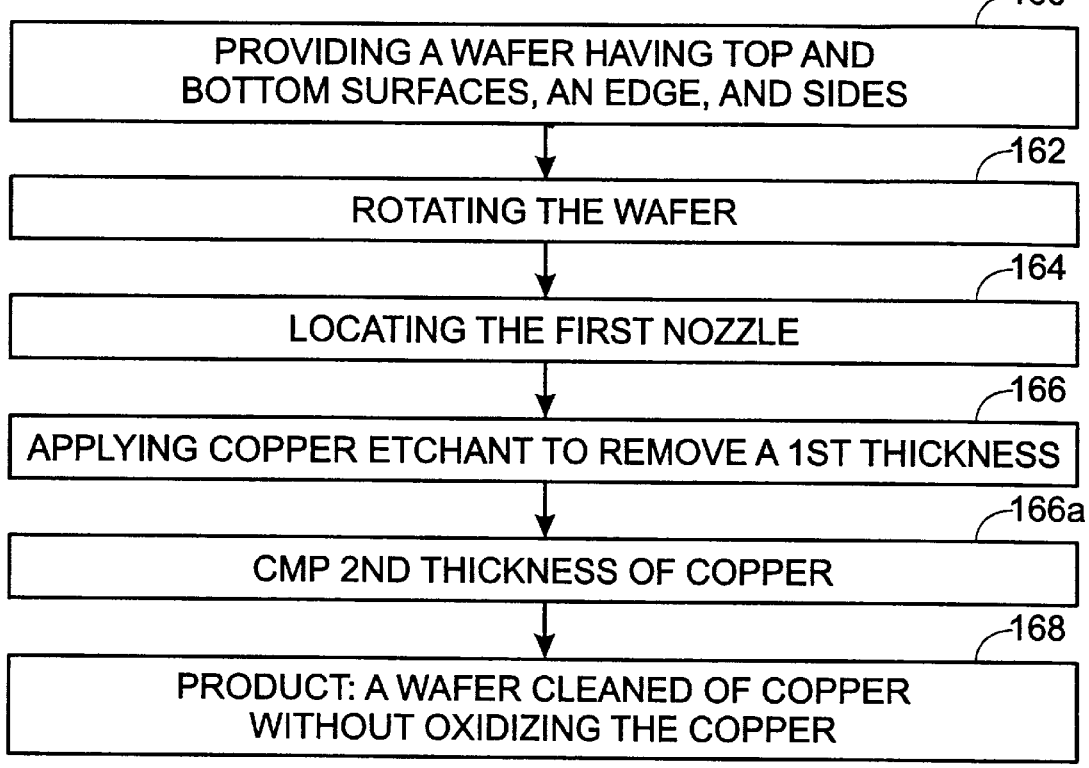
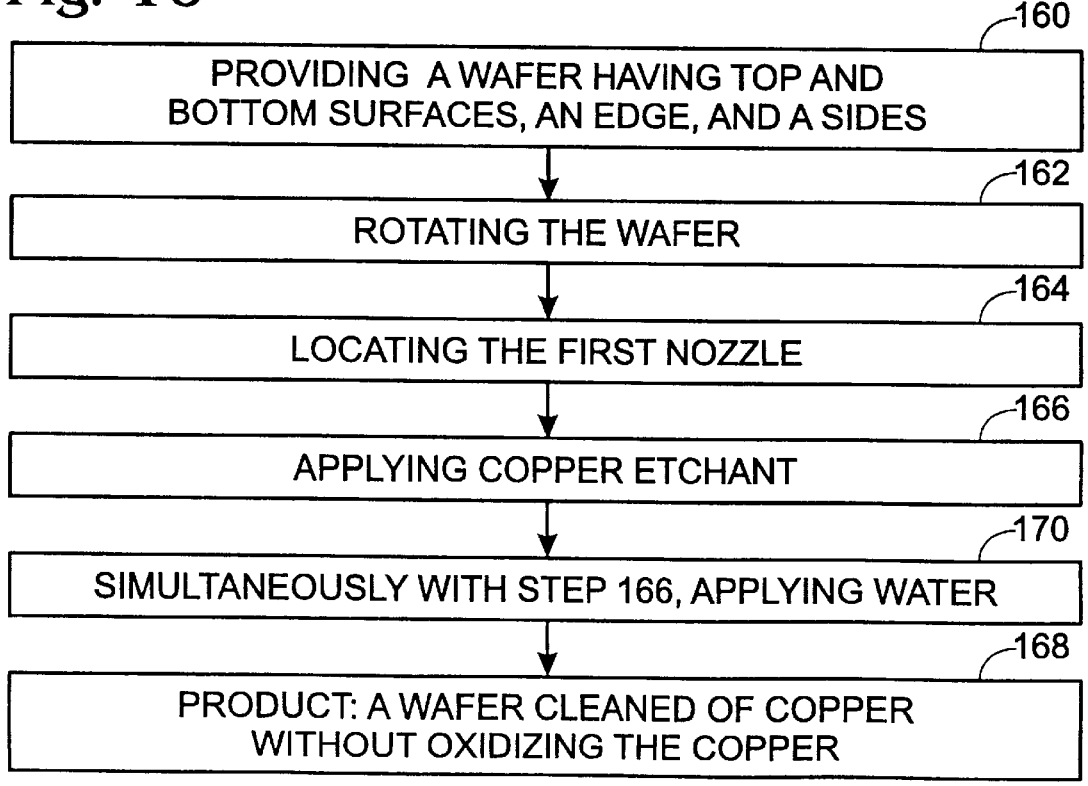

SEMICONDUCTOR WAFER WITH REMOVED CVD COPPER

This application is a divisional application of Ser. No. 08/995,112, filed on Dec. 19, 1997 now U.S. Pat. No. 5,897,379, entitled LOW TEMPERATURE SYSTEM AND METHOD FOR CVD COPPER REMOVAL, invented by Ulrich et al.

BACKGROUND AND SUMMARY OF THE INVENTION

This invention relates generally to integrated circuit (IC) processes and fabrication, and more particularly, a system and method for the low temperature cleaning of copper contaminants from an IC wafer which prevents the formation of copper oxides.

The demand for progressively smaller, less expensive, and more powerful electronic products, in turn, fuels the need for smaller geometry integrated circuits, and large substrates. It also creates a demand for a denser packaging of circuits onto IC substrates. The desire for smaller geometry IC circuits requires that the interconnects between components and through dielectric layers be as small as possible. Therefore, research continues into reducing the width of interconnects. The conductivity of the interconnects is reduced as the surface area of the interconnect is reduced, and the resulting increase in interconnect resistivity has become an obstacle in IC design. Conductors having high resistivity create conduction paths with high impedance and large propagation delays. These problems result in unreliable signal timing, unreliable voltage levels, and lengthy signal delays between components in the IC. Propagation discontinuities also result from intersecting conduction surfaces that are poorly connected, or from the joining of conductors having highly different impedance characteristics.

There is a need for interconnects to have both low resistivity, and the ability to withstand volatile process environments. Aluminum and tungsten metals are often used in the production of integrated circuits for making interconnects between electrically active areas. These metals are popular because they are easy to use in a production environment, unlike copper which requires special handling.

Copper (Cu) is a natural choice to replace aluminum in the effort to reduce the size of lines and vias in an electrical circuit. The conductivity of copper is approximately twice that of aluminum and over three times that of tungsten. As a result, the same current can be carried through a copper line having half the width of an aluminum line.

The electromigration characteristics of copper are also much superior to those of aluminum. Aluminum is approximately ten times more susceptible than copper to degradation and breakage through electromigration. As a result, a copper line, even one having a much smaller cross-section than an aluminum line, is better able to maintain electrical integrity.

There have been problems associated with the use of copper, however, in IC processing. Copper contaminates many of the materials used in IC processes and, therefore, care must be taken to keep copper from migrating. Various means have been suggested to deal with the problem of copper diffusion into integrated circuit material. Several materials, particularly refractory metals, have been suggested for use as barriers to prevent the copper diffusion process. Tungsten, molybdenum, and titanium nitride (TiN) are examples of refractory metals which may be suitable for use as copper diffusion barriers. However, the adhesion of copper to these diffusion barrier materials has been an IC process problem, and the electrical conductivity of such materials is an issue in building IC interconnects.

Metal cannot be deposited onto substrates, or into vias, using conventional metal deposition processes, such as sputtering, when the geometries of the selected IC features are small. It is impractical to sputter metal, either aluminum or copper, to fill small diameter vias, since the gap filling capability is poor. To deposit copper, various chemical vapor deposition (CVD) techniques are under development in the industry.

In a typical CVD process, copper is combined with an organic ligand to make a volatile copper compound or precursor. That is, copper is incorporated into a compound that is easily vaporized into a gas. Selected surfaces of an integrated circuit, such as diffusion barrier material, are exposed to the copper containing gas in an elevated temperature environment. When the volatile copper gas compound decomposes, copper is left behind on the heated selected surface. Several copper compounds are available for use with the CVD process.

Connections between metal levels, such as copper, which are separated by dielectric interlevels, are typically formed with a damascene method of via formation between metal levels. The underlying copper film is first completely covered with the dielectric. A typical dielectric is silicon dioxide. A patterned photoresist profile is then formed over the dielectric. The resist profile has an opening, or hole, in the photoresist corresponding to the area in the dielectric where the via is to be formed. Other areas of the dielectric to be left in place are covered with photoresist. The dielectric not covered with photoresist is then etched to remove oxide underlying the hole in the photoresist. The photoresist is then stripped away. A thin film of copper, or some other metallic material, is then used to fill the via. A layer consisting of dielectric with a copper interconnect through it now overlies the copper film. The excess copper remaining is removed with a chemical mechanical polish (CMP) process, as is well known in the art. The result is an "inlaid" or damascene structure.

Even when circuit structures are masked to prevent copper deposition, or undesired copper is removed in a CMP process, copper may remain on the edges and sides of the wafer where no ICs or circuits are located, as a result of CVD and CMP processes. Copper may migrate to neighboring active regions from the sides and edges of the wafer. Further, copper from a wafer edge may contaminate the wafer transport system, and so be passed on to contaminate other wafers. For this reason it is important to clean the wafers of copper residues following each copper process step. Plasma etching process using Cl and F have also been tried, but the heat generated and by-products have made such a method impractical.

A co-pending application, Ser. No. 08/717,315, filed Sep. 20, 1996, entitled, "Copper Adhered to a Diffusion Barrier Surface and Method for Same", invented by Lawrence J. Charneski and Tue Nguyen, Attorney Docket No. SMT 243, which is assigned to the same Assignees as the instant patent, discloses a method for using a variety of reactive gas species to improve copper adhesion without forming an oxide layer over the diffusion barrier. However, the focus of this patent is to improve copper adhesion, not to remove copper. In addition, the method of the above patent is generally only applicable to diffusion barrier material.

Another co-pending application, Ser. No. 08/729,567, filed Oct. 11, 1996, entitled, "Chemical Vapor Deposition of Copper on an ION Prepared Conductive Surface and Method for Same," invented by Nguyen and Maa, Attorney Docket No. 114, which is assigned to the same Assignees as the instant patent, discloses a method of preparing a conductive surface, such as copper, with an exposure to the ions of an inert gas to improve electrical conductivity between a conductive surface and a subsequent deposition of copper. However, the primary purpose of this invention is to prepare a conductive surface that is substantially free of by-products and IC process debris.

Another co-pending application, Ser. No. 08/861,808, filed May 22, 1997, entitled, "System and Method of Selectively Cleaning Copper Substrates Surfaces, In-Situ, to Remove Copper Oxides," invented by Nguyen et al., Attorney Docket No. 219, which is assigned to the same Assignees as the instant patent, discloses a method to remove copper oxides after they are formed, not to prevent the formation of copper oxides.

It would be advantageous to employ a method of cleaning a copper IC substrate surface while minimizing the formation of copper oxide products in the process.

It would be advantageous to employ a low temperature method of cleaning an IC substrate to selectively remove only copper, so that copper oxides are not given an opportunity to develop.

It would be advantageous if a selective copper cleaning process used a room temperature liquid etchant, and other easy to use IC materials, for the removal of copper. In this manner, the IC would not have to be removed from the chamber for cleaning and exposure to an oxygen atmosphere during the cleaning process.

Accordingly, in the fabrication of a semiconductor wafer having top and bottom surfaces, with a top surface edge, and a side along the top surface edge around the perimeter of the wafer surfaces, a low temperature method for removing copper from the wafer is provided. "Low temperature" means that the process is conducted at or near room temperature, with the etchant diluted enough to prevent a significant increase in temperature due to the energy of the reaction, and with photoresist baking accomplished at temperatures below 95° C. These conditions discourage the oxidation of copper. In one embodiment of the invention, the etchant is nitric acid diluted to 30%.

Currently, the wafer has a 6 or 8 inch diameter. The thickness of the wafer around the perimeter provides a wafer side. This side and the adjoining surface edges require cleaning. The method comprises the steps of:

a) forming a layer of protective coating overlying selected areas the wafer top surface; and b) applying a copper etchant solution to remove copper from portions of the wafer not covered by the protective coating.

Typically, the coating deposited in Step a) is patterned to cover the wafer top surface where the ICs are located. The protective coating is removed from the edges of the top surface and sides of the wafer. The protective coating selected from the group consisting of photoresist, photoresist without photo active compound (PAC), and spin-on glass (SOG). When Step a) includes forming a protective coating with photoresist, it is soft-baked at a temperature of 95° C., or less, for a period of approximately 60 seconds, whereby the low temperature process prevents copper contaminants from oxidizing. When the circular wafer includes at least one straight top surface edge and side, such as the typical 6 inch wafer, Step a) includes depositing photoresist on the wafer top surface, exposing selected areas of the photoresist to light through a shadow-mask in close proximity to the wafer, to chemically alter the exposed photoresist. Then, the photoresist is developed and removed along the straight edge of the top surface.

Following Step b), are the steps of:

c) cleaning the wafer of copper etchant compounds with a de-ionized water rinse; and d) etching the protective coating to completely remove protective coating from the wafer, whereby the wafer, free of copper contaminants, is available for further semiconductor processes.

Typically, the copper removal process uses a spin-etch processor chamber including a spin chuck and a copper etchant nozzle. Then, the method comprising the steps of:

a) rotating the wafer at a first revolution per minute (RPM) rate;

b) locating the nozzle above the top surface edge; and c) applying a copper etchant to the top surface edge, whereby copper is removed from the exposed edges of the top surface and wafer sides.

In some aspects of the invention, a protective coating is not used in the copper etching process. In one process, the deposited copper has a first thickness overlying the edge and a second thickness overlying the copper interconnects toward the center of the disk, and Step c) removes the first thickness around the wafer edge. Then a step follows Step c), of:

d) performing a CMP to remove the second thickness of copper, revealing copper interconnects, whereby copper is removed without the use of a protective coating. In this manner, the deposition of the second thickness copper is used as the protective coating for the interconnects. In another alternate process, water is used as the protective coating. Step $c_2$) includes locating a water nozzle approximately above the center of the wafer. Then, Steps c) and $c_2$) are performed simultaneously, whereby the de-ionized water protects copper structures on the wafer top surface from damage from the copper etchant. Alternately, the process cycles between applying copper etchant and water.

When a photoresist protective coating is used, the method further comprises the steps, preceding Step a), of:

$a_1$) depositing a protective coating, selective to the copper etchant used in Step c), on the top surface of the wafer;

$a_2$) rotating the wafer and locating the second nozzle above the edge of the top surface; and $a_3$) applying a protective coating etchant with the second nozzle to remove the protective coating along the top surface edge and sides of the wafer.

A system for removing copper from a semiconductor wafer disk having top and bottom surfaces, with top surface edges and sides along the top surface edge around the perimeter of the wafer surfaces is also provided. The system comprises an enclosed chamber, a spin-chuck to rotate the mounted wafer, and a first solution application nozzle having at least one position approximately above the wafer perimeter edge to spray copper etchant, to remove copper from the sides and perimeter edge of the wafer. Some aspects of the invention further comprise a de-ionized water application nozzle having at least one position approximately above the center of the wafer, whereby the water is used to remove etchants and etchant compounds from the wafer.

Another nozzle, having at least one position approximately above the wafer edge perimeter, is used to spray a protective coating etchant upon the edge of the wafer top surface along the perimeter, whereby protective coating, masking copper interconnection structures on the wafer top surface, is removed on the edge of the top surface and the wafer sides before copper etchant is applied. The protective coating etchant nozzle is moveable in a plurality of positions between the wafer center and wafer perimeter, when the wafer is mounted on said chuck. This nozzle is moved between the wafer center and wafer perimeter to completely remove any protective coating remaining on the wafer after said first nozzle is used to remove copper from the wafer.

BRIEF DESCRIPTION OF THE DRAWINGS

FIG. 13 is a flow chart illustrating, in the fabrication of a semiconductor wafer, steps in a low temperature method for removing copper from a semiconductor wafer.

FIG. 14 is a flow chart illustrating, in the fabrication of a semiconductor wafer disk, steps in another low temperature method for removing copper from a wafer disk.

FIG. 15 is a flow chart illustrating steps in a CMP method for removing copper from the sides and edge of a wafer disk without the requirement of a protective coating.

FIG. 16 is a flow chart illustrating steps in a de-ionized water spray method for removing copper from the sides and edge of a wafer disk without the requirement of a protective coating.

DETAILED DESCRIPTION OF THE PREFERRED EMBODIMENT

Figure 1A:
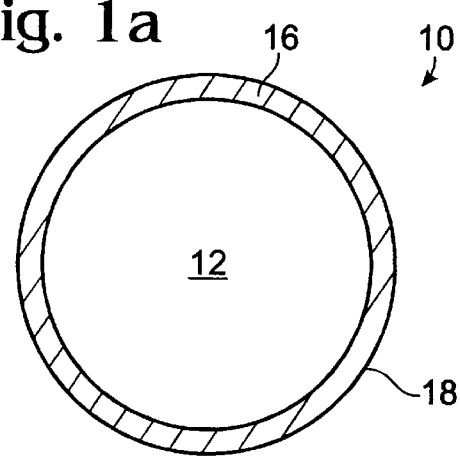
FIG. 1a is a top plane view of a semiconductor wafer.
Figure 1B:
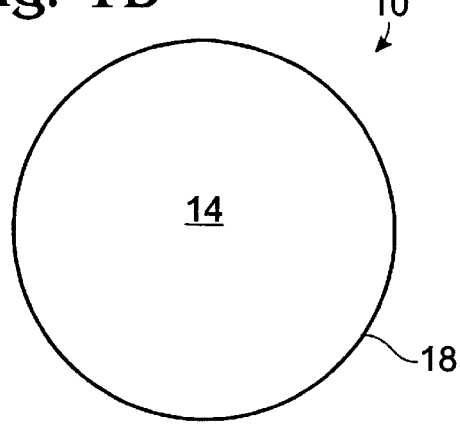
FIG. 1b is a bottom plane view of a semiconductor wafer.
Figure 2:
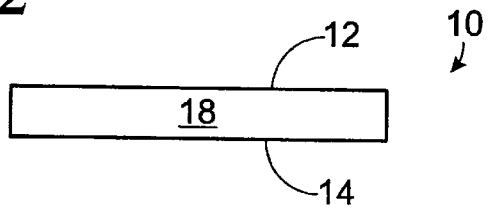
FIG. 2 is a side plane view of the wafer, more completely illustrating the wafer sides.

FIG. 1a is a top plane view of a semiconductor wafer 10. Wafer 10 has a top surface 12. FIG. 1b is a bottom plane view of semiconductor wafer 10. Wafer 10 has a bottom surface 14. Returning again to FIG. 1a, it can be seen that wafer 10 has a top surface edge 16 and sides 18 along top surface edge 16 around the perimeter of wafer surfaces 12 and 14. FIG. 2 is a side plane view of the wafer, more completely illustrating the wafer sides.

Figure 3:
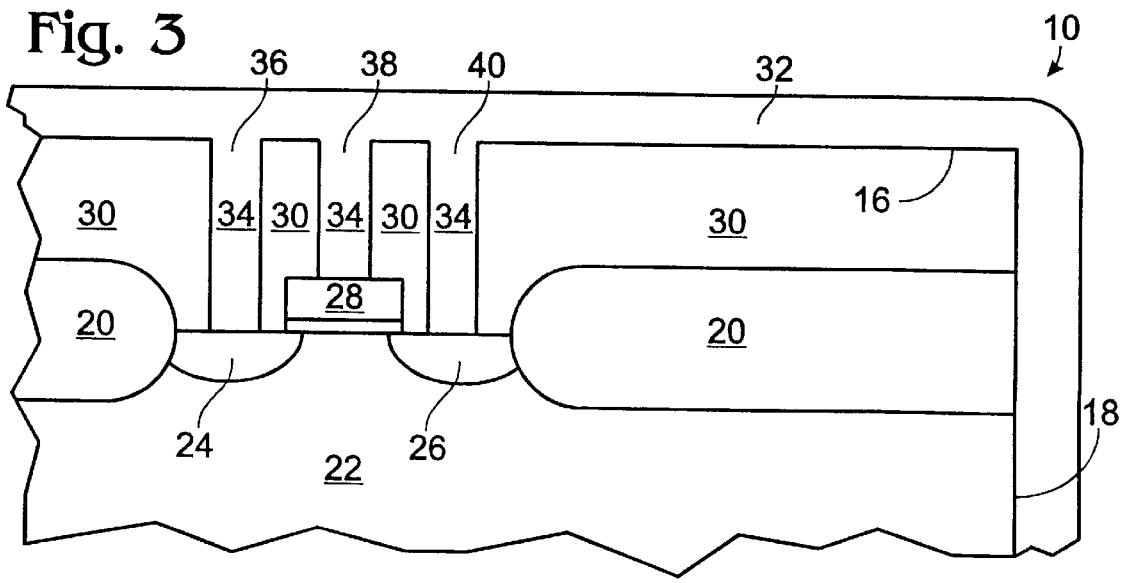
FIG. 3 is a partial cross-sectional view of the wafer illustrated in FIG. 2.

FIG. 3 is a partial cross-sectional view of wafer 10 presented in FIG. 2. Wafer 10 comprises at least one level of silicon. An area of field oxide 20, a doped silicon well 22, and doped active areas 24, 26, and 28 are shown. In some aspects of the invention, active silicon area 24 is a source, active silicon area 26 is a drain, and active silicon area 28 is a gate electrode. A dielectric interlevel 30 overlies the silicon level including areas 20, 22, 24, 26, and 28. Typically, wafer 10 comprises hundreds of ICs, with each IC including thousands, or even millions of transistors. It is also typical that wafer 10 include many levels of metallization separated by interlevel dielectric.

At least one deposition of copper 32, including structures 34 interconnecting said active silicon areas 24, 26, and 28 through vias 36, 38, and 40 in interlevel dielectric 30, is included. Specifically, structures 34 are interconnects in vias 36, 38, and 40. Interconnects 34 are used to electrically interface different active levels in the IC. Other copper interconnects 34 such as lines and dual damascene vias (not shown) are also viable. All above-named structures 34 connect active areas 24, 26, and 28 to other areas of wafer 10 (not shown).

Figure 4:
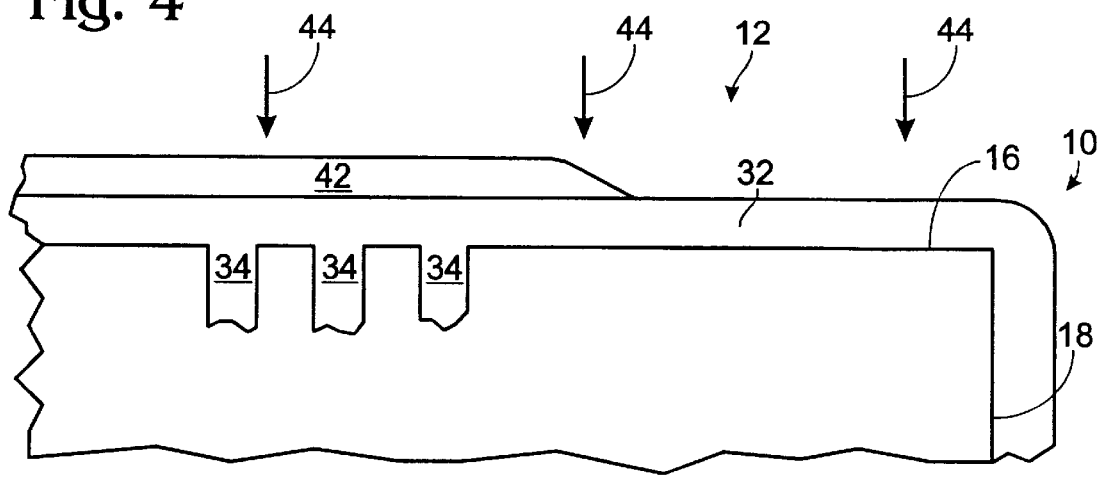
FIG. 4 illustrates the wafer of FIG. 3 with a protective coating covering overlying the top surface.

FIG. 4 illustrates wafer 10 of FIG. 3 with a protective coating 42 covering overlying top surface 12. Copper 32 is removed from top surface edges 16 and sides 18 through a process of applying a layer of protective coating 42 overlying selected areas of wafer top surface 12, and applying a copper etchant solution, represented by arrows 44, to remove copper 32 from portions of the wafer not covered by protective coating 42. Protective coating 42 is selected from the group consisting of photoresist, photoresist without photo active compound (PAC), and spin-on glass (SOG).

Figure 5:
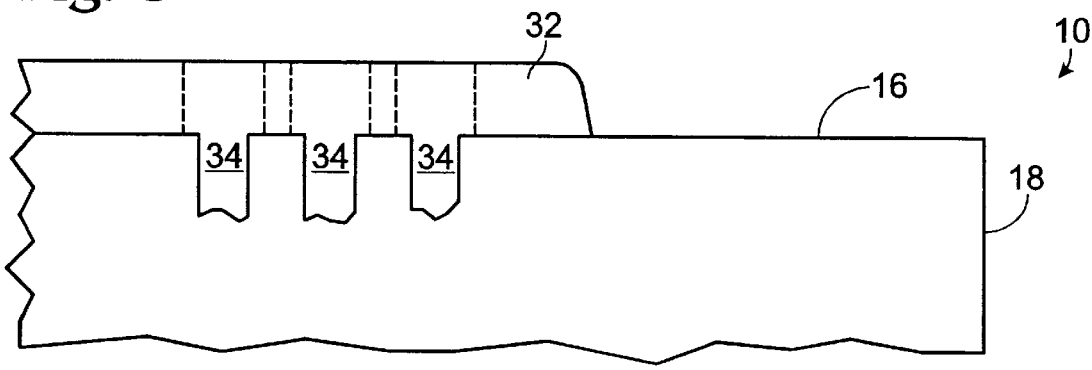
FIG. 5 is the partial cross-section view of the wafer of FIG. 4, after copper has been removed.

FIG. 5 is the partial cross-section view of wafer 10 of FIG. 4, after copper 32 has been removed from the selected areas, edge 16 and side 18. In addition, protective coating 42 has been stripped away following the etching of copper 32. When copper etchant 44 is a solution of nitric acid, having a concentration of less than approximately 30%, copper 32 is removed at low temperatures to minimize copper oxidation.

Figure 6:
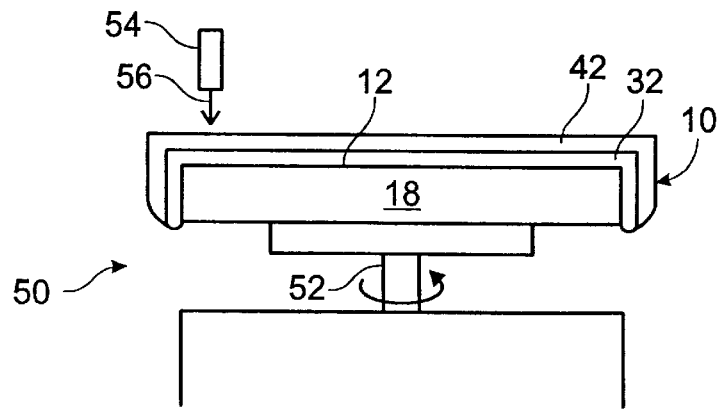
FIGS. 6 and 7 illustrate the use of an edge bead removal (EBR) tool, to remove copper in accordance with the present invention.
Figure 7:
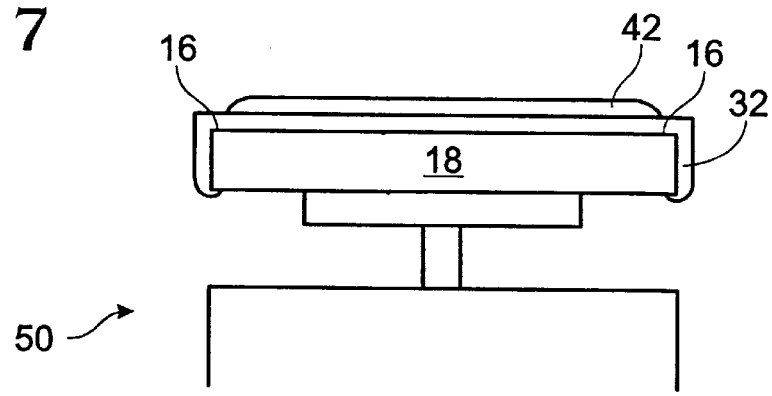

FIGS. 6 and 7 illustrate the use of an edge bead removal (EBR) tool 50, to remove copper 32 in accordance with the present invention. FIG. 6 is a side plane view of a wafer 10 mounted on an edge bead removal (EBR) tool 50. Typically, protective coating 42 is photoresist and the process of removing copper 32 includes patterning photoresist 42 to remove photoresist 42 from top surface edges 16 and sides 18. Specifically, wafer 10 is a disk, and EBR tool 50 includes a spin-chuck 52 and at least one photoresist etchant application nozzle 54. Wafer disk 10 is rotated and photoresist etchant, represented by arrow 56 is applied to top surface 12 within 8 mm of side 18. Photoresist 42 is patterned to expose wafer sides 18 and top surface edge 16. Photoresist solvents such as acetone are used as an etchant in some aspects of the invention. Other etchant choices are dependent on the specific type protective coating, and manufacturer.

FIG. 7 is a side plane view of wafer 10 in FIG. 6, after photoresist etchant 56 has been applied. The rotational motion of wafer 10 prevents etchant 56 from moving into the interior area of top surface 12. Instead, photoresist etchant 56 moves to the outside of wafer disk 10 where photoresist 42 has been removed from edge 16. After copper 32 is exposed on sides 18 and edge 16, copper etchant is applied, as shown in FIGS. 4 and 5, and described above. In some aspects of the invention, etchant 56 is applied to bottom surface 14 with a nozzle (not shown) located under wafer 10.

Figure 8A:
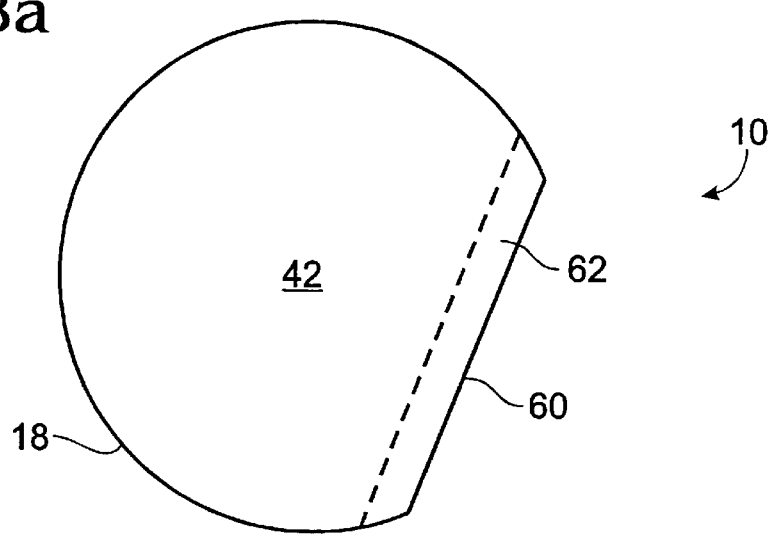
FIGS. 8a–8c illustrate the method of the present invention for removing copper from the edges of a 6 inch commercial wafer disk.
Figure 8B:
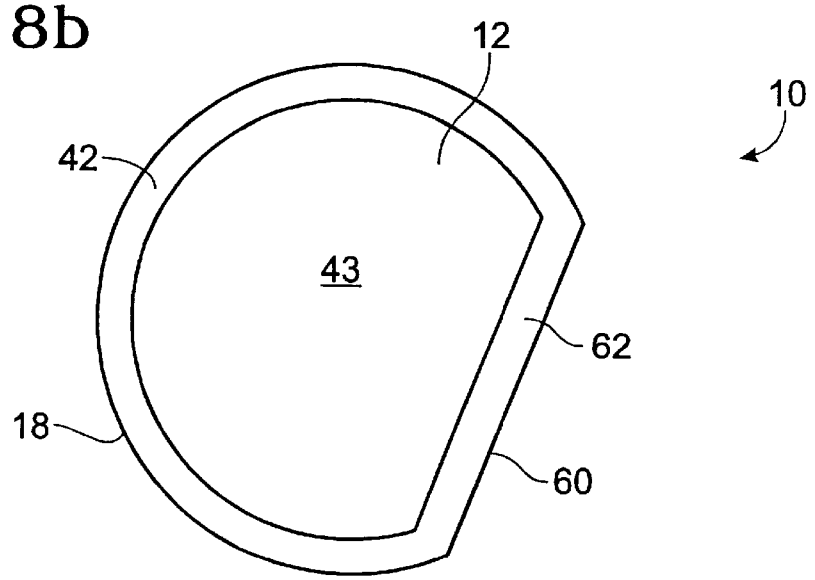
Figure 8C:
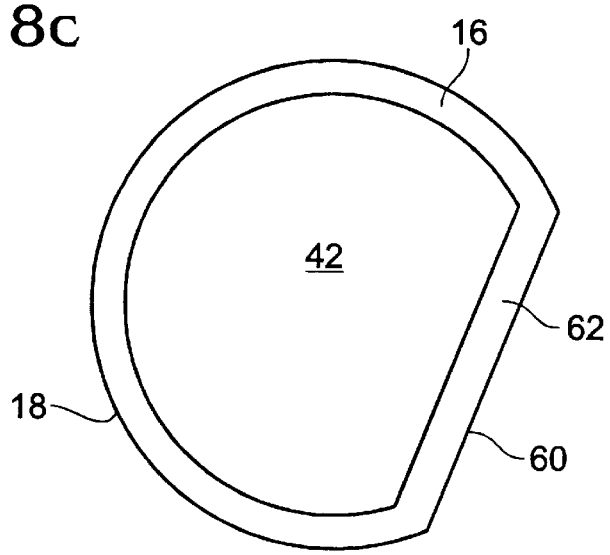

Alternately, wafer 10 has a non-disk shape, and photoresist 42 is formed and patterned using a light exposure process that is well known in the art. In this manner, photoresist 42 is selectively formed on wafer 10 regardless of the shape of wafer 10, or the method of photoresist deposition. FIGS. 8a–8c illustrate the method of the present invention for removing copper from the edges of a 6 inch commercial wafer disk. FIG. 8a is a top plane view of a 6 inch commercial wafer disk 10. Although 6 inch wafer 10 is called a disk, it has a straight flat side 60 and a straight top surface edge 62 for the purpose of location and transportation.

FIG. 8b illustrates wafer disk 10 of FIG. 8a with a photoresist shadow mask 43 In close proximity to wafer top surface 12. The shape of photoresist mask 43 exposes selected areas of photoresist 42 along edge 16, and along edge 62, which is located on top surface 12 adjacent straight side 60. The selected portions of photoresist 42 are exposed to light, chemically altering exposed portions of photoresist 42. Then mask 43 is removed, and photoresist developer is applied to remove the portions of resist 42 exposed to light by mask 43. Alternately, when negative photoresist is used, mask 43 covers edges 16 and 62 (not shown), and covered edges 16 and 62 are developed away. In this manner, photoresist 42 overlying areas 16 and 62 is removed before the copper etch step.

FIG. 8c illustrates edges 16 and 62 cleared of photoresist 42 (and mask 43) in preparation of the copper etching step. Regardless of the process of forming photoresist 42, the process of applying photoresist includes baking the photoresist at a temperature of 95° C., or less, for a period of time less than approximately 60 seconds, whereby the low temperature process prevents said copper from oxidizing.

Figure 9:
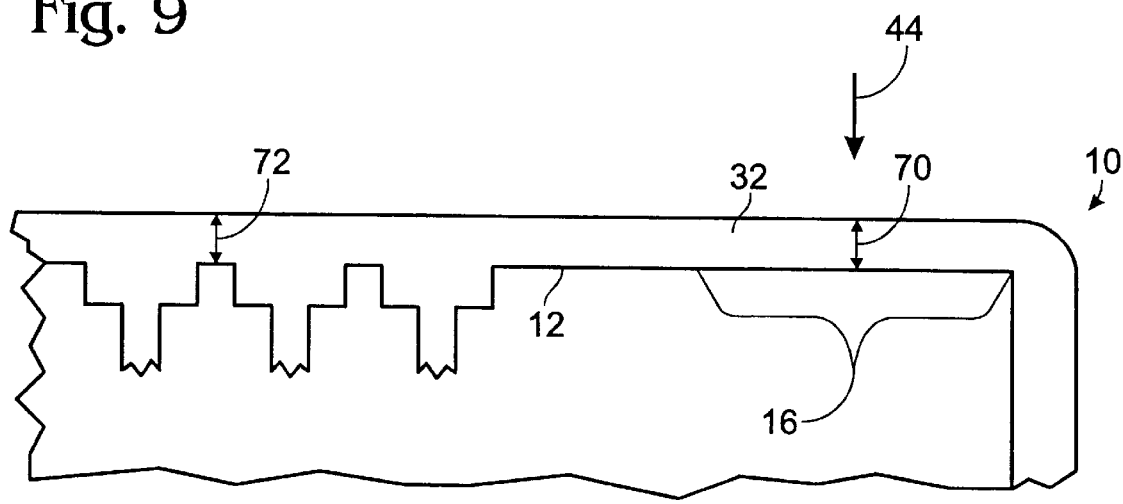
FIGS. 9–11 illustrate steps in the method of forming a completed semiconductor disk with copper removed from the sides and edges in accordance with the present invention.
Figure 10:
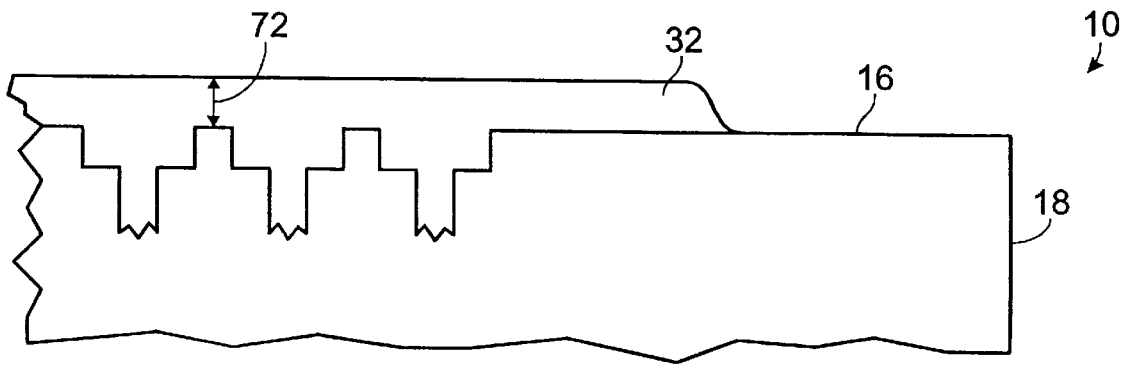
Figure 11:
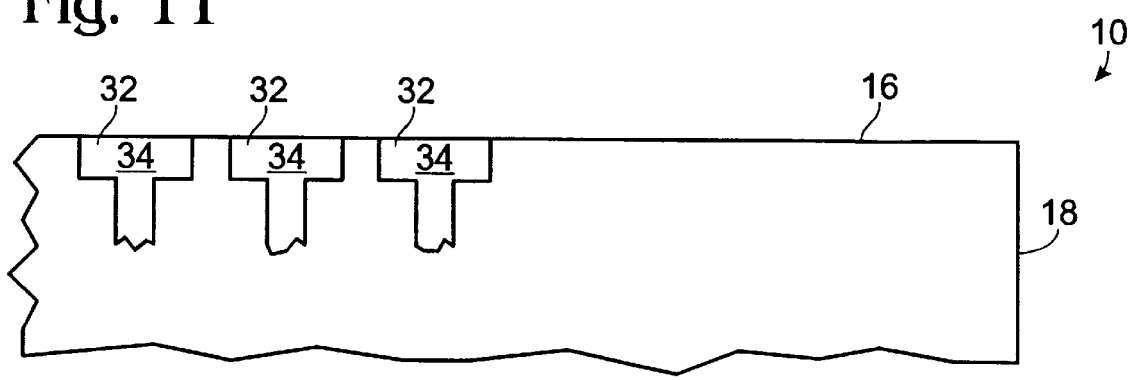

FIGS. 9–11 illustrate steps in the method of forming a completed semiconductor disk 10 with copper 32 removed from sides 18 and edges 16 in accordance with the present invention. FIG. 9 is a more abstract view of wafer 10 in FIG. 3. Not shown are silicon level 20, doped active areas 24, 26, and 28, and interlevel dielectric 30 overlying silicon level 20, see FIG. 3. The process described below illustrates a method of removing copper without the use of photoresist. Typically, it is a process goal to deposit a uniformly thick layer of copper 32 across top surface 12. However the first thickness 70 of copper 32 overlying edge 16 is generally different than the second thickness 72 of copper 32 overlying copper interconnect structures 34. At the same time, copper 32 is also deposited in vias in other spaces to form copper structures 34. Copper 32 is removed from top surface edges 16 and sides 18 through a process of applying copper etchant solution 44 to remove first thickness 70 of copper 32 overlying edge 16 and sides 18.

FIG. 10 depicts wafer 10 of FIG. 9 after the application of copper etchant 44. Etchant 44 has removed first thickness 70 of copper 32 overlying top surface sides 18 and edges 16. FIG. 11 illustrates wafer 10 of FIG. 10, and depicts the results of a chemical mechanical polishing (CMP) process which follows the use of etchant 44. The CMP of top surface 12 removes second thickness 72 of copper 32 overlying copper interconnect structures 34. Interconnection structures 34 are then revealed. Copper 32 is removed in a low temperature, non-oxidizing process without the use of a copper etchant mask.

Figure 12:
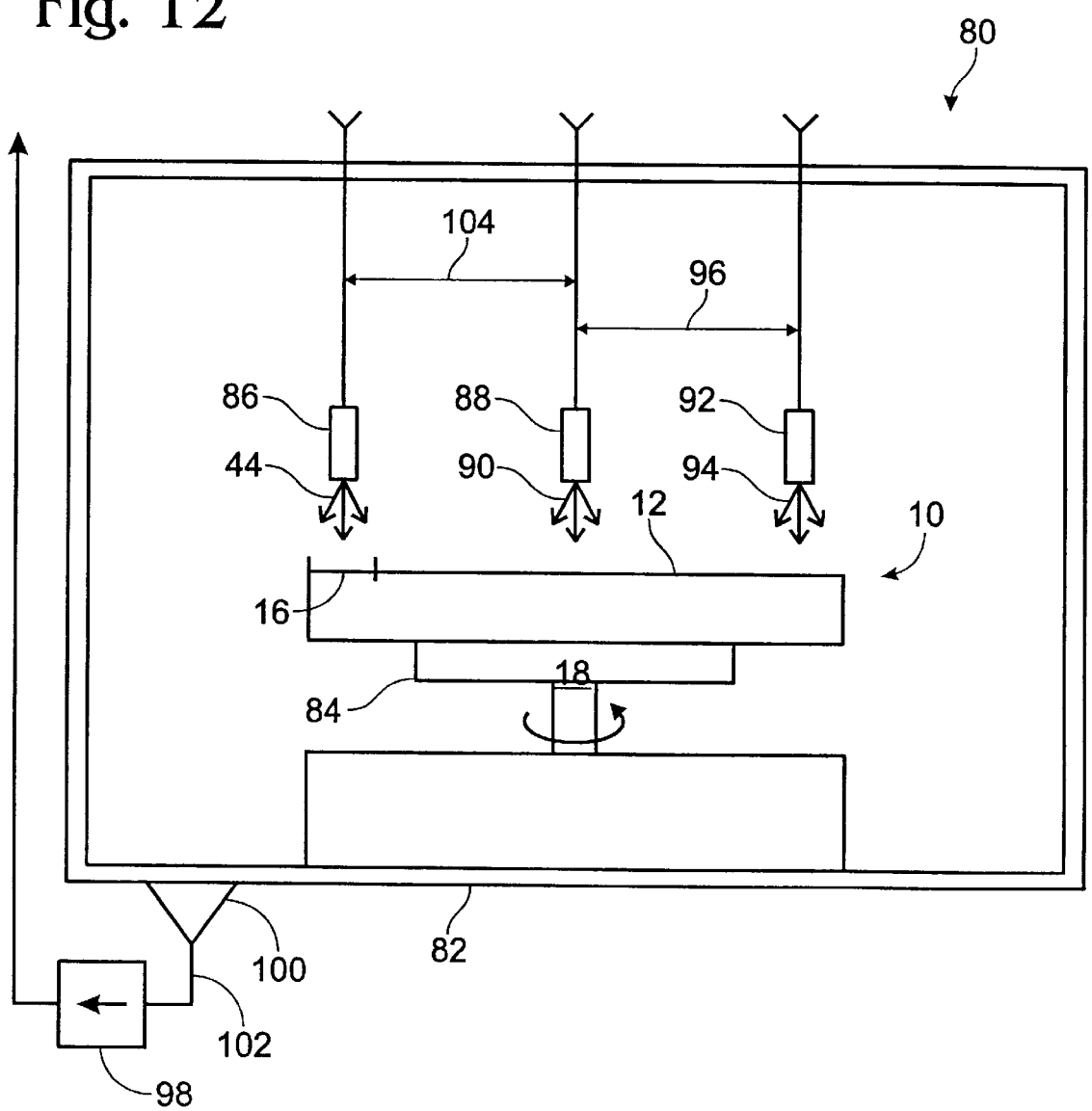
FIG. 12 illustrates a system for removing copper from a semiconductor wafer disk.

FIG. 12 illustrates a system 80 for removing copper from semiconductor wafer disk 10. As above, wafer disk 10 has top 12 and bottom 14 surfaces, with top surface edges 16 and sides 18 along the top surface edge 16 around the perimeter of wafer surfaces 12 and 14, see FIGS. 1a, 1b, and 2. System 80 comprises an enclosed chamber 82. Inside chamber 82 is a spin-chuck 84 having a programmable speed of 0 to 7000 revolutions per minute, to rotate mounted wafer 10. A first solution application nozzle 86 having at least one position approximately above wafer edge 16 to spray copper etchant 44, removes copper 32 from the sides 18 and perimeter edge 16 of wafer 10, whereby copper 32 is removed without oxidization. These most basis components of system 80 are substantially the same as EBR system 50, described in FIGS. 6 and 7. At approximately the same process step as applying copper etchant 44 to top surface 12, wafer bottom surface 14 is typically cleaned of copper with a copper etchant or acetone dispensed by a nozzle (not shown). In some aspects of the invention copper etchant and photoresist etchant nozzles are located under wafer 10 (not shown).

System 80 further comprises a third application nozzle 88 having at least one position approximately above the center of the wafer 10 to spray de-ionized water 90 on wafer 10 to remove etchants and etchant compounds from wafer 10 after copper 32 is removed. A second nozzle 92, having at least one position approximately above wafer edge 16, sprays a protective coating etchant 94 upon edge 16 of the wafer top surface 12 along the perimeter. A protective coating, masking copper interconnection structures 34 on the wafer top surface 12, is removed on edge 16 of the top surface 12 and the wafer sides 18 before copper etchant 44 is applied. In some aspects of the invention, second nozzle 92 is moveable in a plurality of positions, represented by reference designator 96, between the wafer center and wafer edge 16, when wafer 10 is mounted on chuck 84. Second nozzle 92 is moved between the wafer center and wafer edge 16 to completely remove any protective coating remaining on wafer 10 after first nozzle 86 is used to remove copper 32 from wafer 10.

System 80 further comprises a first pump 98 to remove copper etchant compounds, and any other solutions, or solution by-products, at a predetermined vacuum, from chamber 82. Copper etchant 44 is a solution of nitric acid, having a concentration of less than approximately 30%, to promote a low temperature reaction which minimizes oxidation.

The protective coating that is removed by protective coating etchant 94 is selected from the group consisting of photoresist, photoresist without photo active compound (PAC), and spin-on glass (SOG). Reference designator 104 indicates that nozzles 86 and 88 are also moveable from the center of wafer 10, to at least side 18, in some aspects of the invention.

FIG. 13 is a flow chart illustrating, in the fabrication of a semiconductor wafer, steps in a low temperature method for removing copper from a semiconductor wafer. Step 140 provides a semiconductor wafer having top and bottom surfaces, with a top surface edge and a side along the top surface edge around the perimeter of the wafer surfaces. Step 142 forms a layer of protective coating overlying selected areas the wafer top surface. Typically, the wafer top surface selective areas include copper interconnected circuits, and Step 142 includes depositing the protective coating upon the wafer top surface, including the non-selected areas, and etching the protective coating to remove the protective coating from the edges of the top surface and sides of the wafer, but not from the top surface copper interconnections. Step 142 includes a protective coating selected from the group consisting of photoresist, photoresist without photo active compound (PAC), and spin-on glass (SOG). Step 144 applies a copper etchant solution to remove copper from portions of the wafer not covered by the protective coating. Step 144 includes using nitric acid as the copper etchant, having a concentration of less than approximately 30%, whereby the copper is removed at low temperatures to minimize oxidation. Step 146 is a product, a wafer cleaned of copper without oxidizing the copper.

In some aspects of the invention, the wafer includes at least one straight top surface edge and side, as is typical in a commercial 6 inch wafer. Then, Step 142 includes depositing photoresist on the wafer top surface, and exposing selected areas of the photoresist along the top surface edge, including the straight edge, to light through a shadow-mask in close proximity to the wafer, to chemically alter the exposed photoresist. Step 142 includes developing the photoresist to remove photoresist along the straight edge of the top surface, whereby copper is etched from the top surface straight edge in subsequent steps of the method.

When Step 142 includes forming a protective coating with photoresist, a farther step, Step 142a (not shown), follows Step 142, and precedes Step 144. Step 142a soft-bakes the photoresist at a temperature of 95° C., or less, for a period of approximately 60 seconds, whereby the low temperature process prevents copper contaminants from oxidizing.

Following Step 144, and preceding Step 146, are additional steps. Step 144a cleans the wafer of copper etchant compounds with a de-ionized water rinse. Step 144b etches the protective coating to completely remove protective coating from the wafer. The wafer, free of copper contaminants, is available for further semiconductor processes.

In some aspects of the invention, an additional step precedes Step 142. Step 140a (not shown) performs a chemical mechanical polish (CMP) to remove excess copper from the circuit areas of the wafer top surface.

FIG. 14 is a flow chart illustrating, in the fabrication of a semiconductor wafer disk, steps in another low temperature method for removing copper from a wafer disk. Step 160 provides a wafer having top and bottom surfaces, with a top surface edge and a side along the top surface edge around the perimeter of the wafer surfaces. Step 160 also provides a spin-etch processor chamber including a spin chuck and at least a first solution application nozzle for use. Step 162 rotates the wafer at a first revolution per minute (RPM) rate. Step 164 locates the first nozzle above the top surface edge. Step 166 applies a copper etchant with the first nozzle to the top surface edge. Step 166 includes using a solution of nitric acid, having a concentration of less than approximately 30%, whereby the copper is removed at low temperatures to minimize oxidation. Then, Step 162 includes the rate of rotation being in the range between 250 and 1000 RPM. Step 168 is a product, a wafer where copper is removed from the exposed edges of the top surface and wafer sides.

Typically, a protective coating is used in the copper removal process. Step 160 provides a second solution application nozzle. Then, additional steps precede Step 162. Step 160a deposits a protective coating, selective to the copper etchant used in Step 166, on the top surface of the wafer. Preferably, the protective coating is applied in a process step which precedes the mounting of the wafer on the spin-etch chamber. Step 160b rotates the wafer and locates the second nozzle above the edge of the top surface. Step 160c applies a protective coating etchant with a the second nozzle to remove the protective coating along the top surface edge and sides of the wafer.

Step 160a includes a protective coating selected from the group consisting of photoresist, photoresist without photo active compound (PAC), and spin-on glass (SOG). When Step 160a includes using photoresist as a protective coating, Step 160b includes rotating the wafer at a rate of approximately 1000 RPM, and Step 160c) includes applying the etchant to the rotating wafer for a period of approximately 9 seconds.

In some aspects of the invention, Step 160a includes using photoresist as the protective coating, and also includes baking the wafer at a temperature of 95° C., or less, for a period of 60 seconds, or less to cure the photoresist.

In some aspects of the invention, Step 160 provides for a moveable second nozzle. Then, a further step, following Step 166, is included in the method. Step 166b moves the second nozzle from the center of the wafer to the top surface edge, applying photoresist etchant to the entire top surface, to completely removing the photoresist, whereby the wafer is cleaned of copper with low temperature processes.

Some aspects of the invention include a step following Step 166, and preceding Step 166b. Step 166c allows the rotating wafer to come to rest for a period of approximately 15 seconds while still covered with the copper etchant solution, whereby the use of copper etchant is conserved. In some aspects of the invention, the method cycles between Steps 166 and 166b a plurality of times. This procedure saves copper etchant, since etchant is more likely to remain atop a stationary wafer.

In some aspects of the invention, Step 160 provides a third solution application nozzle, and a further step follows Step 166b. Step 166c rotates the wafer and applies de-ionized water with the third nozzle to the wafer top surface, removing copper etchant and copper etchant by-products from the wafer. In some aspects of the invention, the method cycles between Steps 166, 166b, and 166c a plurality of times. In some aspects of the invention, all three nozzles are moveable from the wafer center to at least the wafer edge.

FIG. 15 is a flow chart illustrating steps in a CMP method for removing copper from the sides and edge of a wafer disk without the requirement of a protective coating. This method is essentially the same as Steps 160, 162, 164, 166, and 168 of FIG. 14, and the steps are not repeated here in the interest of brevity. Step 160 provides a layer of copper having a first thickness overlying the wafer top surface edge and sides, and a second thickness of copper overlying the copper interconnect structures toward the center of the wafer, as shown in FIGS. 9 through 11. Step 166 includes removing the first thickness of copper overlying the top surface sides and edges. A Step 166a, following Step 166, performs a CMP to remove the second thickness of copper overlying the interconnect structures, revealing the copper interconnection structures.

FIG. 16 is a flow chart illustrating steps in a de-ionized water spray method for removing copper from the sides and edge of a wafer disk without the requirement of a protective coating. Steps 160, 162, 164, 166, and 168 are substantially the same as FIGS. 14 and 15, described above. An additional step, Step 170, follows Step 164. Step 170 rotates the wafer, locates the third nozzle at approximately the center of the wafer, and applies de-ionized water with the third nozzle to the wafer top surface, removing copper etchant and copper etchant by-products from the wafer. Step 170 is performed simultaneously with Step 166, whereby the de-ionized water protects copper structures on the wafer top surface from damage from the copper etchant.

A low cost and simple system and method of removing copper from the sides and edges of a standard commercial semiconductor wafer have been presented, above. The processes are carried out with conventional fabrication materials, and conventional process equipment is readily adaptable. Another advantage of the process is that the copper is removed at low temperatures. The low temperatures help insure that neither the copper to be removed, or the copper that remains is oxidized. Oxidized copper is difficult to remove, it also presents copper interface problems with regard to conductivity and adhesion. Finally, high temperature process are more likely to cause the migration of copper particles into sensitive silicon active areas of the IC. The above-mentioned processes have been directed to the removal of copper from the top surface of a wafer. However, the processes are also applicable to the wafer bottom surface, or both surfaces. Other variations of the present invention will occur to those skilled in the art.

What is claimed is:

1. A semiconductor wafer having top and bottom surfaces, with a top surface edge and sides along said top surface edge around the perimeter of said wafer surfaces, the wafer comprising at least one level of silicon, including doped active areas, at least one interlevel dielectric overlying said silicon level, and at least one deposition of copper including structures interconnecting said active silicon areas through contact holes in said interlevel dielectric, with copper being removed from said top surface edges and sides through a process of applying a layer of protective coating overlying selected areas of said wafer top surface, and applying a copper etchant solution to remove said copper from portions of the wafer not covered by protective coating, whereby said copper is removed in a low temperature, non-oxidizing process.

2. A wafer as in claim 1 protective coating selected from the group consisting of photoresist, photoresist without photo active compound (PAC), and spin-on glass (SOG).

3. A wafer as in claim 2 in the protective coating is photoresist and in which the process of removing said copper includes patterning the photoresist to remove photoresist from said top surface edges and sides.

4. A wafer as in claim 3 wherein the wafer is a disk and an edge bead removal (EBR) tool, with a spin-chuck and at least one photoresist etchant application nozzle, is provided to rotate the wafer disk and apply photoresist etchant on said top surface within 8 mm of said side, whereby the photoresist is patterned to expose said wafer sides and top surface edge.

5. A wafer as in claim 4 wherein the wafer includes at least one straight top surface edge and side, and the process of patterning photoresist includes exposing the photoresist to light through a shadow mask in close proximity to the wafer top surface, chemically altering exposed portions of the photoresist, before the photoresist developer is applied.

6. A wafer as in claim 3 in which the process of applying photoresist includes baking the photoresist at a temperature of 95° C., or less, for a period of time less than approximately 60 seconds, whereby the low temperature process prevents said copper from oxidizing.

7. A wafer as in claim 1 in which the copper etchant is a solution of nitric acid, having a concentration of less than approximately 30%, whereby said copper contaminants are removed at low temperatures to minimize oxidation.

8. A semiconductor wafer having top and bottom surfaces, with a top surface edge and sides along said top surface edge around the perimeter of said wafer surfaces, the wafer comprising at least one level of silicon, including doped active areas, at least one interlevel dielectric overlying said silicon level, and at least one deposition of copper having a first thickness overlying the top surface edge and a second thickness overlying copper interconnect structures, with copper being removed from said top surface edges and sides through a process of applying a copper etchant solution to remove said first thickness of copper overlying said top surface sides and edges, followed by a chemical mechanical polishing (CMP) to remove said second thickness of copper overlying said interconnect structures, revealing said copper interconnection structures, whereby said copper is removed in a low temperature, non-oxidizing process without the use of a copper etchant mask.

\* \* \* \* \*

UNITED STATES PATENT AND TRADEMARK OFFICE
CERTIFICATE OF CORRECTION

PATENT NO. : 6,020,639
DATED : February 1, 2000
INVENTOR(S) : Bruce Ulrich, et. al.

It is certified that error appears in the above-identified patent and that said Letters Patent is hereby corrected as shown below:

Title page, item [*] Notice should be deleted.

Signed and Sealed this

Fourteenth Day of November, 2000

Attest:

Q. TODD DICKINSON

*Attesting Officer*  *Director of Patents and Trademarks*